United States Patent [19]

Haas et al.

[11] 4,064,453
[45] Dec. 20, 1977

[54] MAGNETIC FIELD DETECTOR

[75] Inventors: Werner E. L. Haas, Webster; Gary A. Dir, Fairport, both of N.Y.

[73] Assignee: Xerox Corporation, Stamford, Conn.

[21] Appl. No.: 702,361

[22] Filed: July 2, 1976

[51] Int. Cl.² ............................................. G01R 33/02
[52] U.S. Cl. ..................................... 324/214; 324/260; 324/244
[58] Field of Search ................. 324/38, 43; 252/62.51, 252/62.52; 350/151

[56] References Cited

U.S. PATENT DOCUMENTS

| 2,848,748 | 8/1958 | Crump | 324/38 |
| 3,239,753 | 3/1966 | Arnold | 324/43 R |
| 3,764,540 | 10/1973 | Khalafalla | 252/62.52 |
| 3,843,540 | 10/1974 | Reimers | 254/62.52 |

Primary Examiner—M. Tokar
Attorney, Agent, or Firm—James J. Ralabate; George J. Cannon; James P. O'Sullivan

[57] ABSTRACT

A magneto-optic cell comprising a composition responsive to magnetic fields. The composition comprises a ferrofluid and metal flakes which align with the ferrofluid in response to magnetic lines of force and along the magnetic lines of force. Detection of the presence of a magnetic field is thereby provided.

10 Claims, 5 Drawing Figures

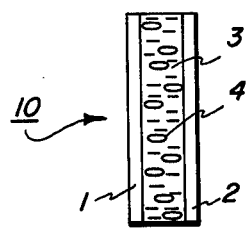
FIG. 1
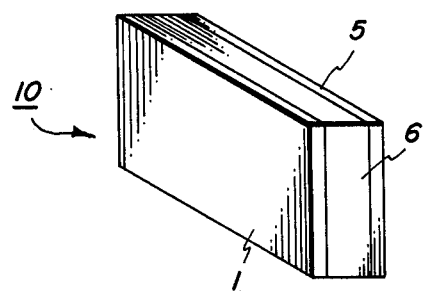
FIG. 2
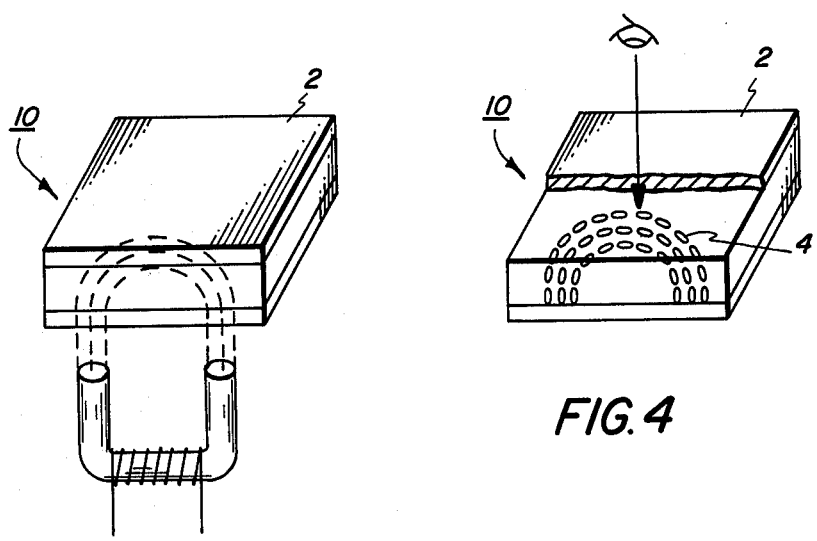
FIG. 3
FIG. 4

MAGNETIC FIELD DETECTOR

BACKGROUND OF THE INVENTION

This invention relates to magnetic field detectors and, more particularly, to detectors utilizing compositions for visible indication of the presence of a magnetic field.

A well-known class of magnetic field detectors is the compass family which utilizes a needle which aligns with the earth's magnetic field to provide an indication of direction relative to indicia on the compass.

In many situations, it is desirable to learn merely by visible indication whether a magnetic field is present or whether the magnetic field is one of a particular spatial configuration. For example, a visible indication of whether a magnetic tape is in the recorded or erased state is oftentimes desirable. Furthermore, in processes where the absence of a magnetic field is required such as in the cooling step of thermoremanent erasure of a magnetically recorded tape it is desirable to determine simply and visibly that the cooling tape is not being subjected to an applied magnetic field.

U.S. Pat. No. 3,013,206 to Youngquist et al. discloses a magnetic reader comprising a hollow non-ferromagnetic vessel having a cavity filled with a suspension of flat, visible, weakly ferromagnetic crystals which orient when suspended in the liquid and in response to a magnetic field.

SUMMARY OF THE INVENTION

It is a further object of this invention to provide a novel magnetic field detector.

It is, therefore, an object of this invention to provide a novel magnetic field detector responsive to magnetic fields, the response of which is easily visibly detectable.

The foregoing objects and others are accomplished in accordance with this invention by forming a magneto-optic cell filled with a composition comprising a ferrofluid and metal flakes. The composition can be readily fabricated by adding metal flakes such as, for example, aluminum flakes, to a ferrofluid which can be either water based or hydrocarbon based. Optionally, a compatible diluent can be added to comprise up to about 98.5 percent by weight of the resulting composition in some embodiments and these compositions still exhibit visible detection when subjected to the influence of a magnetic field.

BRIEF DESCRIPTION OF THE DRAWINGS

FIG. 1 is a schematic illustration of the magneto-optic magnetic field detector of the present invention.

FIG. 2 is a schematic illustration of an alternate embodiment of the magneto-optic cell showing a hollow vessel within which the magnetic field detecting composition is placed.

FIGS. 3 and 4 respectively schematically illustrate the magneto-optic cell subjected to a magnetic field and the resulting visible reaction of the magnetic field detecting composition within the cell.

DETAILED DESCRIPTION OF THE PREFERRED EMBODIMENTS

Figure 5:
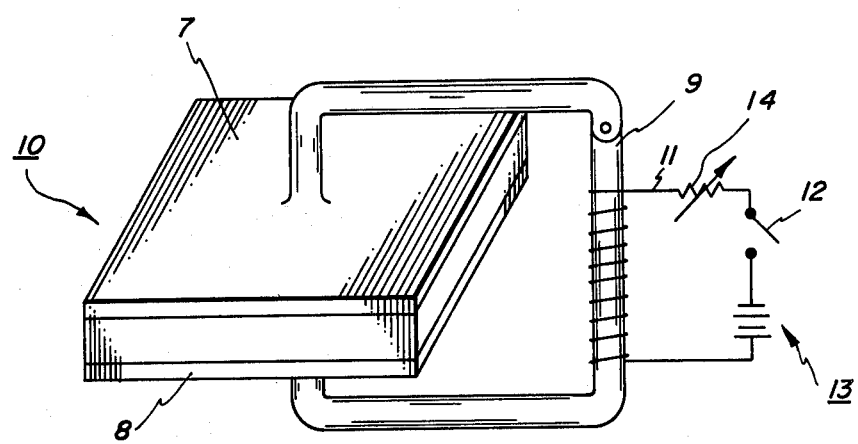
FIG. 5 schematically illustrates a magnetic field detector with magnitude determination capability.

The present invention, referring to FIG. 1, is directed to a magneto-optic cell 10 comprising magnetic field permeable substrates 1 and 2, at least one of which is transparent; and, a composition sandwiched therebetween comprising ferrofluid 3 having suspended therein metal flakes 4.

"Ferrofluids" as used herein means stable colloidal dispersions of ferri- or ferro-magnetic particles in a liquid medium. The liquid medium can be either water or a hydrocarbon liquid medium. The ferri- or ferromagnetic particles do not flocculate or settle out under the influence of either gravatational or magnetic fields. Ferrofluids behave much like their liquid vehicle in the absence of a magnetic field; however, when a field is applied, the colloidal particles carry their surfactant coating in a substantial solvation sheath along the field gradient. Typically, the surfactant employed is a long-chain organic acid such as oleic acid, linoleic acid; succinic acid derivatives; ECA 3852 manufactured by Exxon Corporation. The particles are less than a critical size to be colloidally stable and in order that the energy of domain wall formation be greater than the energy for rotation of all the spins in the particle.

For a description of ferrofluids, see "Magnetic Fluids" by S. E. Khalafalla in *Chem. Tech.*, page 540, Sept. 1975; and "Some Applications of Ferrofluid Magnetic Colloids", by Kaiser and Miskolczy, *IEEE Transactions on Magnetics,* page 694, volume MAG-6, No. 3, Sept. 1970.

Generally speaking, magnetic material can exhibit three modes of magnetic behavior depending on particle size. Superparamagnetic behavior, one of the three modes, is exhibited by different materials at particles sizes which vary with the identity of the material. A simplified relationship which allows an approximation for determining the maximum particle diameter at which a given material will exhibit superparamagnetism is given by the equation "Critical volume = $25kT \div K$" where $k$ is Boltzmann's constant ($1.38 \times 10^{-16}$ erg/degree $T$ is the Kelvin temperature, and $K$ is the magnetic anisotropy in erg/cubic centimeter. This equation is an approximation for spherical uniaxial particles of equal size. The anisotropy values for K are related to the measureable anisotropy constants $K_1$ and $K_2$ by: $K = K_1/4$ when $K_1$ is greater than 0: and $K = K_1/12 + K_2/27$ when $K_1$ is less than 0. For example, at $T = 298°$ Kelvin, the maximum diameters for superparamagnetic behavior in spherical particles of iron, cobalt, and magnetite are respectively: 250 angstroms, 120 angstroms, and 600 angstroms. For a more thorough discussion of superparamagnitism, see "Superparamagnetism" by C. P. Bean and J. D. Livingston, *J Appl Phys,* supplement to volume 30, no. 4, page 1205 (1959).

Typical suitable ferrofluids for use in accordance with the practice of the present invention may be prepared by ball-milling the magnetic particles for periods of about 1,000 hours in the presence of a surfactant as disclosed in "Magnetic Properties of Stable Dispersions of Sub-domain Magnetite Particles", *J Appl Phys,* volume 41, page 1064, by R. Kaiser and G. Miskolczy (1970). Residual coarse material may be centrifuged or allowed to settle out in order to produce a stable ferrofluid by this mechanical milling method. Other methods of preparing ferrofluids include chemical precipitation methods. See, for example, "Preparing Magnetic Fluids by a Peptizing Method", U.S. Bureau of Mines Technical Progress Report 59, G. W. Reimers and S. E. Khalafalla, Sept. 1972; and U.S. Pat. No. 3,228,881 to Thomas directed to a method of preparing a dispersion of discrete particles of ferromagnetic metals.

Commercially available ferrofluids, such as, for example, ferrofluids exhibiting superparamagnetic behavior can be employed in the practice of the present invention. Such ferrofluids are commercially available from Ferrofluidics Corporation of Burlington, Massachusetts.

Once the superparamagnetic fluid has been prepared, by whatever method, or obtained commercially, metal flakes are added thereto, and, optionally, an appropriate diluent is added. By "appropriate diluent" it is meant that the diluent is compatible with the carrier liquid used in making the ferrofluid; for example, if the ferrofluid is water based, the diluent is water. Similarly, if the ferrofluid is hydrocarbon based, the diluent is a hydrocarbon liquid.

The metal flakes to be added to the ferrofluids can comprise any size flakes which will remain suspended in the ferrofluid and not settle out under conditions of use. In this regard, metal flakes of a size of about 325 mesh or smaller in size than about 325 mesh is preferred. However, larger size flakes can be employed provided they do not settle out of the ferrofluid. Metals of good reflectivity are preferred in the practice of the present invention since it is the reflection of light from the board surface area of the flakes which provides contrast between magnetic field aligned portions of the composition and non-aligned portions of the composition. In this regard, aluminum flakes available from Aluminum Corporation of America have been found to provide excellent results when used in the practice of the present invention. However, any metal flake can be employed which provides an optical characteristic in alignment which is visibly distinguishable from that presented by the flake when viewed on edge or on end.

It has been found that metal flakes suspended in ferrofluids will become aligned in the direction of the magnetic field to which they are subjected and that, furthermore, the alignment is such that predominantly the broad surface area of the metal flake aligns parallel to the magnetic field direction to which the composition is subjected. While the mechanism which accounts for this alignment of the metal flake in a ferrofluid which is subjected to a magnetic field is unknown, it is believed that a guest-host interaction is involved. That is, it is believed that the formation of chains by the magnetic particles in the ferrofluid when subjected to a magnetic field causes the metal flakes suspended in the ferrofluid to align with the chain formation.

While preferred ranges of ferrofluid, diluent and metal flakes are presented in the examples set forth below, it will be appreciated that amounts of components outside these ranges can be employed. For example, in the examples presented below, the magnetic field was varied between 0.5 gauss and 300 gauss. The designation "too thick" and "too thin" in the examples set forth below indicate that satisfactory optical contrast was not achieved with a magnetic field between about 0.5 gauss and about 300 gauss. In the case of a designation "too thick" a magnetic field greater than about 300 gauss should be employed. Where the designation "too thin" appears, it indicates that for the relatively small planer sample tested, the amount of aluminum flakes contained in the sample did not give satisfactory optical contrast. A larger area display should provide results which are suitable to low resolution imaging requirements.

The following examples are set forth to illustrate both preferred embodiments of the present invention and to give guidance to one skilled in the art as to the relative compositional values which are satisfactory for relatively low magnetic field strength imaging; i.e., magnetic field strengths between about 0.5 gauss to about 300 gauss. These examples are given as illustrative but not limiting examples of the present invention. In all cases, unless otherwise noted, the ferrofluids were obtained from Ferrofluidics Corporation of Burlington, Massachusetts and had a magnetic saturation of about 200 gauss; the hydrocarbons liquid diluent was SOHIO Product 3440 commercially available from Standard Oil Company of Ohio; the metal flakes were aluminum flakes of a size which permits passage through a 325 mesh screen, commercially available from Alcoa and parts and percentages are by weight.

EXAMPLE I

A water based composition comprising one part (10%) water based ferrofluid; one part (10%) metal flakes; and, eight parts (80%) water is made by adding the flakes and water to the ferrofluid and stirring to achieve a resulting composition of uniform appearance. The composition is placed between an about four micron thick piece of Mylar film and a glass microscope slide to form a magneto-optic cell. The cell is subjected to a magnetic field which is varied between about 0.5 gauss and about 300 gauss.

Prior to being subjected to the magnetic field, the cell appears dark black. Upon being subjected to the field, the metal flakes impart an aluminum appearance to portions of the cell subjected to the magnetic field.

The remaining hydrocarbon based ferrofluid examples are performed in the manner of Example I. The compositional values and results are set forth in Table I, below. *D means diluent, *FF means ferrofluid and *MF means metal flakes. In each example, the result is based on a magnetic field varied between about 0.5 gauss and about 300 gauss.

TABLE I

| EXAMPLE I | Parts *D | Parts *FF | Parts *MF | Result |
|---|---|---|---|---|
| II | 0 | 1(50%) | 1(50%) | Too Thick |
| III | 10(83%) | 1(8⅓%) | 1(8⅓%) | O.K. |
| IV | 20(91%) | 1(4½%) | 1(4½%) | O.K. |
| V | 50(96%) | 1(2%) | 1(2%) | O.K. |
| VI | 100(98%) | 1(1%) | 1(1%) | Too Thin |
| VII | 0 | 1(33%) | 2(67%) | Too Thick |
| VIII | 20(87%) | 1(4⅓%) | 2(8⅔%) | Too Thick |
| IX | 40(93%) | 1(2%) | 2(5%) | O.K. |
| X | 100(97%) | 1(1%) | 2(2%) | O.K. |
| XI | 200(98.5%) | 1(.5%) | 2(1%) | O.K. |
| XII | 0 | 1(20%) | 4(80%) | Too Thick |
| XIII | 10(67%) | 1(6.6%) | 4(26.4%) | Too Thick |
| XIV | 20(80%) | 1(4%) | 4(16%) | Marginally O.K. |
| XV | 50(91%) | 1(1.8%) | 4(7.2%) | O.K. |
| XVI | 100(95%) | 1(1%) | 4(4%) | O.K. |

It is to be noted that the above results were obtained with magnetic fields applied between about 0.5 gauss and about 300 gauss. Accordingly, in some cases, magnetic fields greater than about 300 gauss would have to be employed or, in the alternative compositional variations beyond Table I would have to be employed to abtain satisfactory optical results. For example, it is noted in Table I that in examples II, VII, and XII, the resulting composition was too thick to provide satisfactory optical characteristics. In these examples, no diluent was added to the ferrofluid-metal flake composition and the ferrofluid was always present in an amount no greater than an equal part by weight of the metal flakes. The thickness of the resulting composition in those three examples can be altered by varying the ratio of ferrofluid to metal flakes such that the ferrofluid is always present in a greater amount by weight than the metal flakes. In this manner, suitable optical response can be obtained for magnetic fields between about 0.5 gauss and about 300 gauss. It is to be noted that as earlier defined, a ferrofluid contains a liquid carrier in which the superparamagnetic particles are colloidally suspended. Accordingly, the addition of greater amounts of ferrofluid relative to metal flakes will inherently dilute the resulting composition. As a matter of preference, the addition of diluent is preferred rather than the use of more ferrofluid simply as a matter of practical economics.

Referring now to FIG. 2, there is shown an alternate embodiment of the magneto-optic cell 10 employing a hollow vessel comprising paired, opposed walls 1, 5 and 6. As in the case of FIG. 1, the magnetic field responsive composition is retained by walls or substrates which are permeable to magnetic fields. That is, the walls or substrates employed in FIGS. 1 and 2 are non-ferromagnetic and comprise materials which do not shunt magnetic fields which intercept them.

Typical suitable materials for substrates 1 and 2 in FIG. 1 and for paired opposed walls 1, 5 and 6 in FIG. 2 comprise glass and plastics. At least one wall or substrate is transparent so that the response of the composition 3 to the presence of a magnetic field can be visibly detected. Where the viscosity of composition 3 is sufficiently great, the embodiment of FIG. 1, a sandwich configuration, can be employed. In cases where the viscosity of 3 is relatively low, the hollow vessel embodiment of FIG. 2 is employed. This embodiment can be conveniently fabricated by utilizing transparent epoxy resins or other typically suitable transparent optical glues. When five of the six walls in the FIG. 2 embodiment are glued together, composition 3 can be poured into the cavity and the sixth wall glued into place; or, upon completion of vessel fabrication in FIG. 2, a small hole is drilled through one of the walls and composition 3 inserted by syringe. The hole can then be plugged with epoxy resin or other suitable materials.

Referring now to FIGS. 3 and 4, magnetic field lines emanating from one pole of a horseshoe magnet intercepts magneto-optic cell 10 prior to terminating in the other pole of the horseshoe magnet. For purposes of clarity, only three magnetic field lines are shown in FIG. 3. FIG. 4 demonstrates the relative positioning of metal flakes 4 relative to the path of interception of the magnetic field lines with magneto-optic cell 10. As previously stated and is shown in FIG. 4, metal flakes 4 are aligned predominantly in the direction of the magnetic field lines and with the broad surface area of the metal flakes having the same relationship with respect to substrate 2 as the magnetic field lines. That is, when the magnetic field lines are angularly disposed with respect to substrate 2 so will be the metal flakes and the broad surface area of the metal flakes. Thus, as seen in FIG. 4, a viewer would see less of the broad surface area and more of the endpoints of the metal flakes along the terminal regions of metal flake distribution in FIG. 4; whereas the viewer will see more of the broad surface area and less of the endpoints of the metal flakes along the central region of metal flake distribution in FIG. 4.

Thus, with respect to the detection of the presence of a magnetic field, whenever a magnetic field intercepts magneto-optic cell 10 alignment of metal flakes along the magnetic field line direction will occur and is detectable due to reflection of light from the broad surface areas of the metal flakes in alignment. In regions of magneto-optic cell 10 not subjected to a magnetic field, the metal flakes are randomly oriented and the composition of ferrofluid and metal flakes appear substantially darker in those regions than in regions subjected to a magnetic field. Thus, owing to the alignment of metal flakes, the direction of the magnetic field can be detected as well as its presence.

Furthermore, by the addition of appropriate pole pieces and appropriate circuitry, the magnitude of the magnetic field can also be ascertained. This embodiment is schematically illustrated in FIG. 5 wherein magneto-optic cell 10 is sandwiched between pole pieces 8 and 7. Pole pieces 8 and 7 are pole pieces of an electromagnetic with further includes a core 9 about which is wound wire 11 found in a circuit comprising a switch 12, a power source 13, and a variable resistor 14. In operation, pole piece 7 is pivoted out of contact with magneto-optic cell 10 to facilitate detection of the presence of a magnetic field. Once a magnetic field is detected, pole piece 7 is pivoted down into contact with magneto-optic cell 10 and switch 12 is closed. By slowly varying variable resistor 14 to allow more current to flow in the turns of wire 11, an electromagnetic field is created and slowly increased between pole pieces 8 and 7 until the metal flakes are uniformly aligned in a direction substantially orthogonal to the pole pieces. At this point, the electromagnetic field overcomes the effect of the detected magnetic field. An ammeter placed in the circuit of wire 11 and calibrated to read amperes or gauss will give an indication of relative strengths of detected magnetic fields.

While this invention has been described with respect to particularly preferred embodiments, it would be appreciated by those skilled in the art that the invention is not limited thereto.

What is claimed is:

1. A magnetic field detector, comprising between two magnetic field permeable substrates a layer of composition comprising ferrofluid and metal flakes said metal flakes being suspended in said ferrofluid and magnetically detached from magnetic particles in said ferrofluid yet capable of being aligned in the direction of a magnetic field to which the ferrofluid is subjected, one of said substrates being transparent.

2. The magnetic field detector of claim 1 wherein said composition further comprises a diluent.

3. The magnetic field detector of claim 2 wherein said composition comprises by weight from about 80% to about 98.5% diluent, from about 0.5% to about 8.5% ferrofluid, and from about 1% to about 16% metal flakes.

4. The magnetic field detector of claim 2 wherein said diluent comprises water.

5. The magnetic field detector of claim 4 wherein said composition comprises by weight about 10% ferrofluid and about 10% metal flakes.

6. The magnetic field detector of claim 2 wherein said diluent comprises a hydrocarbon liquid.

7. The magnetic field detector of claim 6 wherein said composition comprises about one part ferrofluid, about one part metal flakes and from about 10 to about 50 parts diluent.

8. The magnetic field detector of claim 6 wherein said composition comprises about one part ferrofluid, about two parts metal flakes and about 40 to about 200 parts diluent.

9. The magnetic field detector of claim 6 wherein said composition comprises about one part ferrofluid, about four parts metal flakes and from about 40 to about 200 parts diluent.

10. The magnetic field detector of claim 1 further comprising an electro-magnet terminating in two opposed pole pieces, one of said pole pieces in contact with the other of said substrates and the other of said pole pieces selectively removable from contact with said transparent substrate.

* * * * *